(12) United States Patent
Israr et al.

(10) Patent No.: US 9,913,058 B1
(45) Date of Patent: Mar. 6, 2018

(54) SONIC FIELD SOUND SYSTEM

(71) Applicant: Disney Enterprises, Inc., Burbank, CA (US)

(72) Inventors: Ali Israr, Monroeville, PA (US); Ivan Poupyrev, Pittsburgh, PA (US); Yoshio Ishiguro, Nagoya (JP); Olivier Bau, San Francisco, CA (US); Yuri Suzuki, London (GB); James H. Auger, Funchal (PT)

(73) Assignee: Disney Enterprises, Inc., Burbank, CA (US)

( * ) Notice: Subject to any disclaimer, the term of this patent is extended or adjusted under 35 U.S.C. 154(b) by 0 days.

(21) Appl. No.: 15/491,890

(22) Filed: Apr. 19, 2017

(51) Int. Cl.
*H04R 29/00* (2006.01)
*H04R 1/28* (2006.01)
*H04R 3/04* (2006.01)
*G06F 3/044* (2006.01)

(52) U.S. Cl.
CPC ........... *H04R 29/001* (2013.01); *G06F 3/044* (2013.01); *H04R 1/2811* (2013.01); *H04R 3/04* (2013.01); *H04R 2499/11* (2013.01)

(58) Field of Classification Search
CPC ...... H04R 29/001; H04R 1/2811; H04R 3/04; H04R 2499/11; G06F 3/044
See application file for complete search history.

(56) References Cited

U.S. PATENT DOCUMENTS

| 5,147,986 A * | 9/1992 | Cockrum | H04R 1/2842 181/145 |
| 8,737,632 B2 * | 5/2014 | Denney, III | G10K 11/02 381/61 |
| 2014/0161278 A1 * | 6/2014 | Konno | H04R 5/04 381/94.2 |

* cited by examiner

*Primary Examiner* — David Ton
(74) *Attorney, Agent, or Firm* — Farjami & Farjami LLP

(57) ABSTRACT

According to one implementation, a sonic field sound system includes a computing platform having a hardware processor and a memory storing a sound modulation software code. The sound system further includes an acoustic object coupled to an input of the computing platform via a capacitance sensing unit. The acoustic object has one or more input interface(s) coupled to an output of the computing platform, and also has a resonant cavity having at least one outlet. The hardware processor is configured to execute the sound modulation software code to generate a waveform for driving the one or more input interface(s) of the acoustic object via the output of the computing platform to produce a sound.

20 Claims, 7 Drawing Sheets

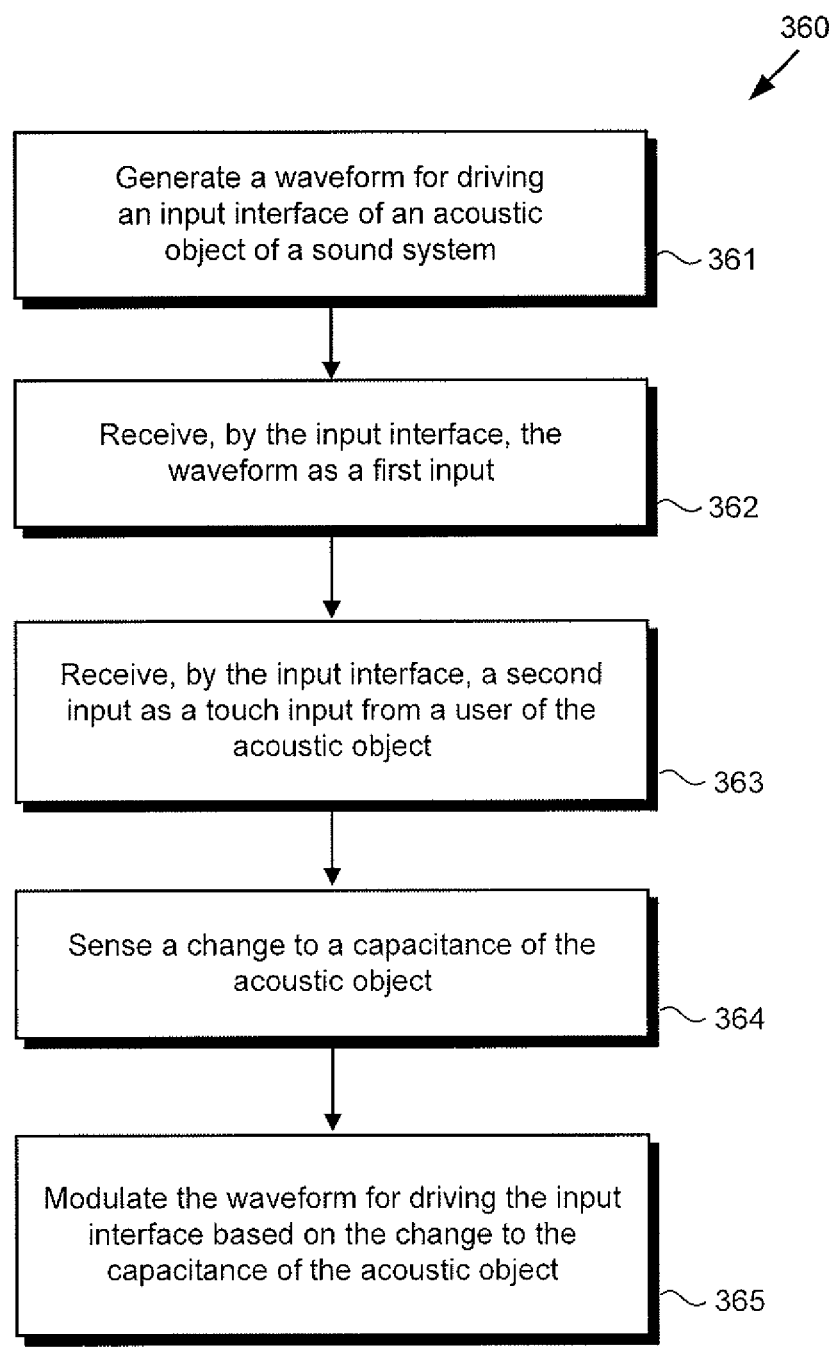

SONIC FIELD SOUND SYSTEM

BACKGROUND

The urge to generate, listen to, and interact with sound, such as music, is an inherently human trait. Moreover, sounds can affect our perceptions of the experiences they accompany. For example, high energy, syncopated rhythms may be purposefully utilized as accompaniments to exercise or physical labor, enlivening otherwise routine and repetitive physical movements, and even causing athletes and workers to voluntarily increase the tempo of their efforts.

As inspiring and powerful as the human relationship to music and other sounds can be, however, one traditional constraint on their enjoyment has been the requirement of specialized equipment, such as specially designed speakers, for modulating, amplifying, and projecting those sounds. Consequently, there is a need for a solution that enables the use of everyday objects as interactive speakers.

SUMMARY

There are provided sonic field sound systems and methods for their use, substantially as shown in and/or described in connection with at least one of the figures, and as set forth more completely in the claims.

BRIEF DESCRIPTION OF THE DRAWINGS

FIG. 3 shows a flowchart presenting an exemplary method for use by a sonic field sound system, according to one implementation;

DETAILED DESCRIPTION

Figure 1:
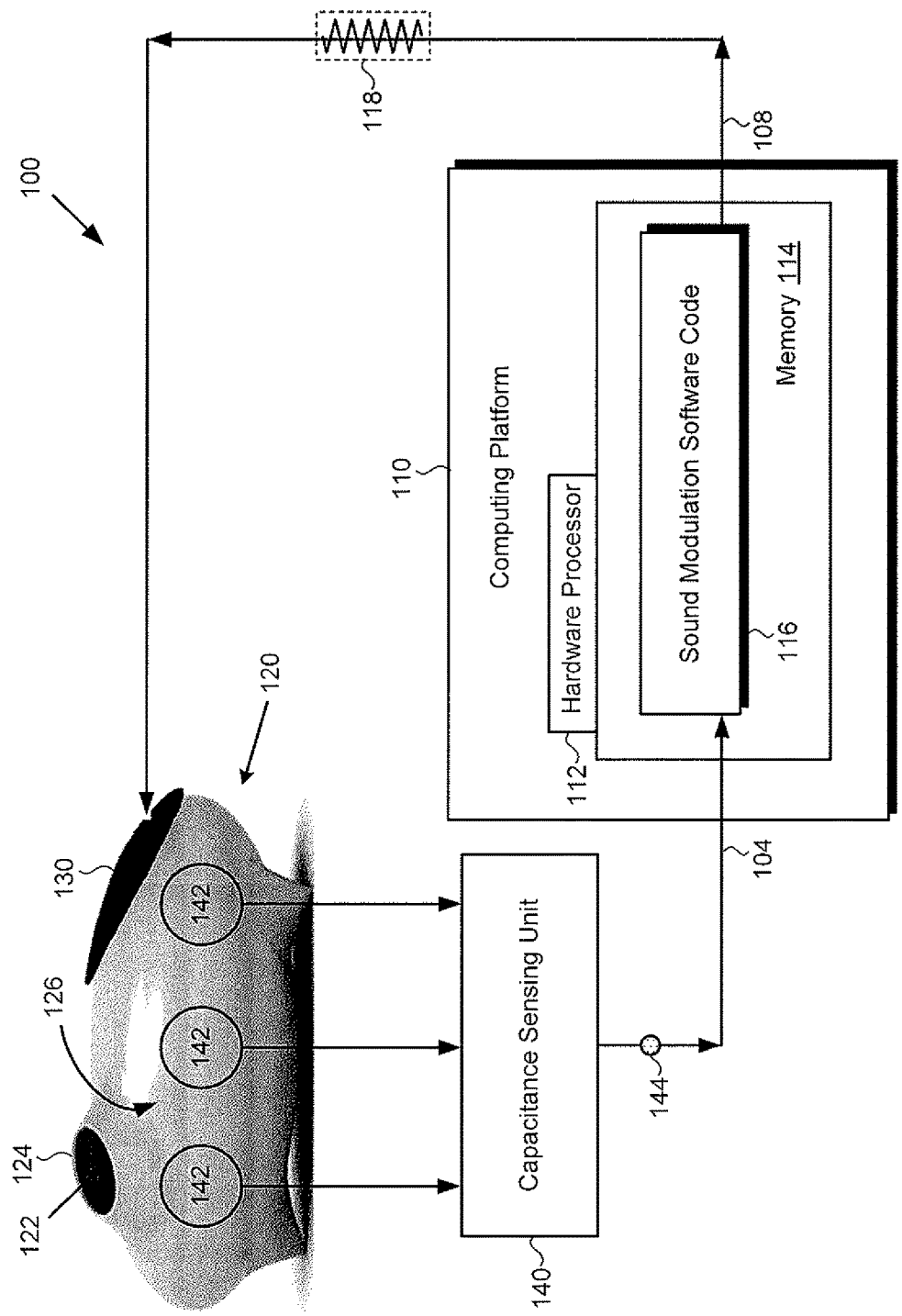
FIG. 1 shows an exemplary sonic field sound system including an acoustic object, according to one implementation.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

As stated above, the urge to generate, listen to, and interact with sound, such as music, is an inherently human trait. However, as inspiring and powerful as the human relationship to music and other sounds can be, one traditional constraint on their enjoyment has been the requirement of specialized equipment, such as specially designed speakers, for modulating, amplifying, and projecting those sounds.

The present application discloses sonic field sound systems and methods for their use that address and overcome the deficiencies in the conventional art by enabling the use of everyday objects as interactive speakers. By applying an electrical waveform to an input interface of an acoustic object, which may be an everyday object, a varying electrostatic field is generated at a surface of the input interface. When the input interface receives a second input in the form of a touch input from a user, the user's finger and the surface form a transducer that renders a sound that may initially be inaudible. By using a resonance cavity provided by the shape of the acoustic object to amplify the sound, and by modulating the electrical waveform applied to the input interface based on changes in the capacitance of the acoustic object, audible sound can be produced.

FIG. 1 shows an exemplary sonic field sound system including acoustic object 120, according to one implementation. As shown in FIG. 1, in addition to acoustic object 120, sound system 100 includes computing platform 110 having hardware processor 112, and memory 114 storing sound modulation software code 116. Sound system 100 also includes capacitance sensing unit 140 having capacitive sensors 142 distributed at surface 126 of acoustic object 120.

Acoustic object 120 may be an everyday object, such as a lamp, toy, or figurine, for example, and may be a free standing object or a handheld object. According to the exemplary implementation shown in FIG. 1, acoustic object 120 includes input interface 130 and resonant cavity 122 having outlet 124. As shown in FIG. 1, acoustic object 120 is coupled to input 104 of computing platform 110 via capacitance sensing unit 140. As further shown in FIG. 1, input interface 130 of acoustic object 120 is coupled to output 108 of computing platform 110. Also shown in FIG. 1 are waveform 118 output by computing platform 110, and capacitance 144 of acoustic object 120 sensed by capacitance sensing unit 140 using capacitance sensors 142.

As is described in greater detail below, hardware processor 112 of computing platform 110 can execute sound modulation software code 116 to generate waveform 118 for driving input interface 130 of acoustic object 120 via output 108 of computing platform 110 to produce a sound. In addition, hardware processor 112 of computing platform 110 can execute sound modulation software code 116 to modulate waveform 118 driving input interface 130 based on changes to capacitance 144 of acoustic object 120.

It is noted that computing platform 110 may be implemented as any of a wide variety of computing devices or systems. For example, in various implementations, computing platform 110 may take the form of a personal computer (PC), laptop computer, tablet computer, smart TV, or gaming console. In other implementations, computing platform 110 may take the form of a mobile communication device, such as a digital media player or smartphone. It is further noted that although FIG. 1 depicts capacitance sensing unit 140 as including three capacitance sensors 142 distributed at surface 126 of acoustic object 120, that representation is merely exemplary. In other implementations, capacitance sensing unit 140 may include one, fewer than three, more than three, or many more than three capacitance sensor(s) 142.

Figure 2A:
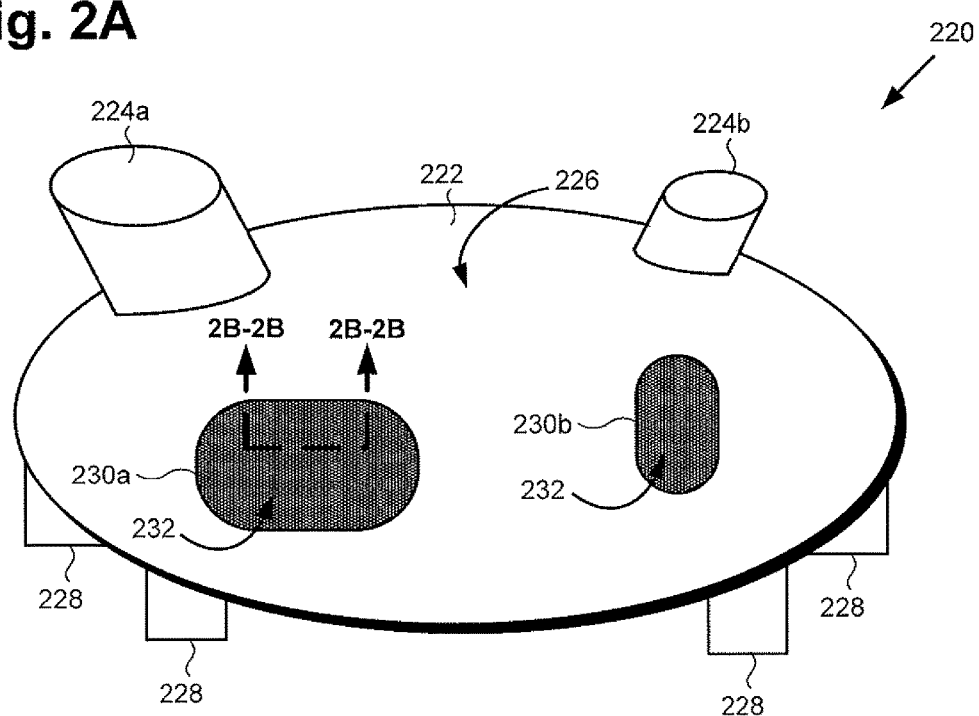
FIG. 2A shows another exemplary implementation of an acoustic object suitable for use as part of a sonic field sound system.

FIG. 2A shows another exemplary implementation of acoustic object 220 suitable for use as part of a sonic field sound system, such as sound system 100, in FIG. 1. Acoustic object 220, in FIG. 2, corresponds in general to acoustic object 120, in FIG. 1, and may share any of the characteristics attributed to that corresponding feature by the present disclosure.

As shown in FIG. 2A, acoustic object 220 is a free standing object having legs 228 supporting resonant cavity 222. It is noted that in other implementations, however, acoustic object 220, like acoustic object 120, can take the form of a handheld object. In contrast to acoustic object 120, resonant cavity 222 of acoustic object 220 includes multiple outlets 224a and 224b at surface 226. Acoustic object 220 also includes multiple input interfaces 230a and 230b at surface 226, each having surface layer or film 232 (hereinafter "surface film 232"). In other words, and as depicted by FIGS. 1 and 2A, acoustic object 120/220 may include resonant cavity 122/222 having one or more outlets 124/224a/224b, and/or may include one or more input interfaces 130/230a/230b.

As also shown in FIG. 2A, when acoustic object 120/220 includes multiple outlets 224a and 224b, those outlets may have different dimensions, and in some implementations, different shapes. Moreover, and as further shown in FIG. 2A, when acoustic object 120/220 includes multiple input interfaces 230a and 230b, those input interfaces may also have different dimensions, and in some implementations, different shapes.

Figure 2B:
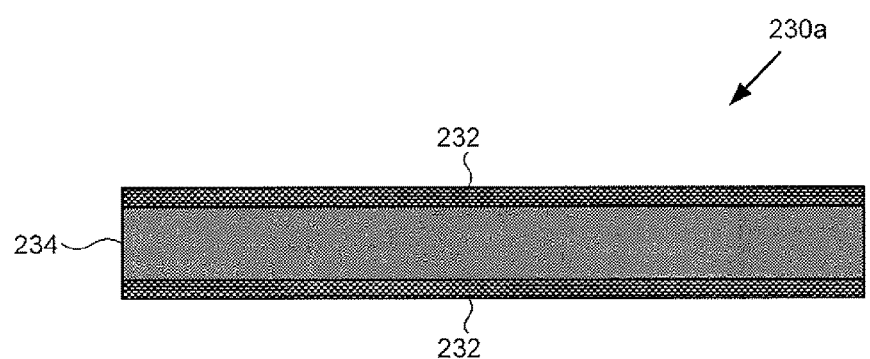
FIG. 2B shows a cross-sectional view of an exemplary input interface of an acoustic object utilized in a sonic field sound system, according to one implementation.

FIG. 2B shows a cross-sectional view of exemplary input interface 230 along perspective lines 2B-2B, in FIG. 2A, according to one implementation. As shown in FIG. 2B, input interface 230a includes conductive plate 234 situated between and adjoined by surface films 232. It is noted that input interface 230 corresponds in general to any or all of input interfaces 130, 230a, and 230b in FIGS. 1 and 2A, and each of those corresponding figures may share the characteristics attributed to any corresponding feature by the present disclosure. In other words, like input interface 230, each of input interfaces 130, 230a, and 230b may include conductive plate 234 situated between and adjoined by surface films 232.

Conductive plate 234 may be a metal plate, for example, such as an aluminum or copper plate, or a plate formed of a metal alloy. More generally, however, conductive plate 234 may be formed of any material having a suitable high electrical conductivity. Surface films 232 may be dielectric surface films adjoining conductive plate 234. For example, in implementations in which conductive plate 234 is an aluminum plate, surface films 232 may be anodized aluminum films formed at the outer surfaces of conductive plate 234. As shown by FIGS. 2A and 2B, conductive plate 224 is covered by surface film 232 at surface 126/226 of acoustic object 120/220.

It is noted that, in addition to, or as an alternative to acoustic object 120/220, the present inventive principles for providing a sonic field sound system can be applied to environmental surfaces, and even to the human body. For example, in some implementations, a sound recording can be transmitted from person-to-person via physical contact. In one such implementation, an inaudible, high voltage, low power version of recorded sound is transmitted to a first person's body when the first person is holding a metallic object. As a result, a modulated electrostatic field is produced around the first person's skin. When the first person touches an ear of a second person, this modulated electrostatic field creates a very small vibration of the ear lobe. As a result, the first person's finger and the second person's ear, together, form an interactive speaker that makes the recorded sound audible for the second person.

Figure 4A:
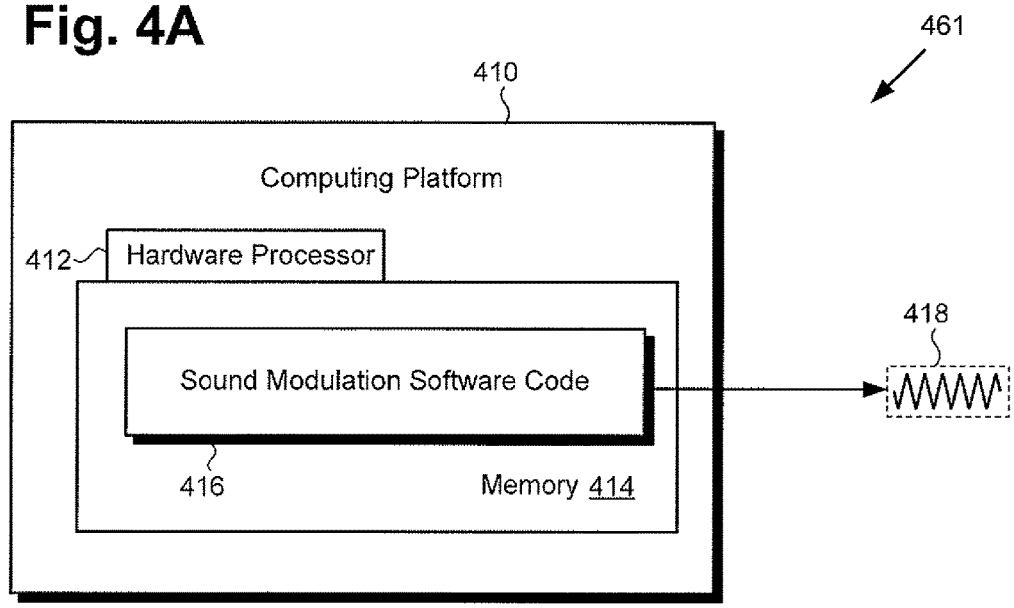
FIG. 4A shows an exemplary diagram corresponding to an initial action of the method outlined by the flowchart of FIG. 3.

Returning now to the acoustic object based sonic field sound systems represented by FIGS. 1, 2A, and 2B, FIG. 3 shows flowchart 360 presenting an exemplary method for use by such a sound system, according to one implementation. In addition, FIG. 4A shows exemplary diagram 461 corresponding to an initial action of flowchart 360. Proceeding on to FIGS. 4B, 4C, and 4D, exemplary diagrams 462, 463, and 464 shown in those respective figures correspond to subsequent actions of flowchart 360. Furthermore, FIG. 4E shows exemplary diagram 465 corresponding to a final action of flowchart 360.

It is noted that, like the features shown in FIGS. 1, 2A, and 2B, the features shown in FIGS. 4A, 4B, 4C, 4D, and 4E are provided as specific implementations of the present inventive principles, and are shown with such specificity for the purposes of conceptual clarity.

Referring now to FIG. 4A, FIG. 4A shows diagram 461 depicting computing platform 410 and waveform 418 provided at output 408 of computing platform 410. As further shown by FIG. 4A, computing platform 410 includes hardware processor 412, and memory 414 storing sound modulation software code 416.

Computing platform 410, output 408, hardware processor 412, memory 414, and sound modulation software code 416 correspond respectively in general to computing platform 110, output 108, hardware processor 112, memory 114, and sound modulation software code 116, in FIG. 1, and those corresponding features may share any of the characteristics attributed to either corresponding feature by the present disclosure. In addition, waveform 418, corresponds in general to waveform 118, in FIG. 1, and those corresponding features may share any of the characteristics attributed to either corresponding feature by the present disclosure.

Continuing to refer to FIG. 4A in conjunction with FIGS. 1, 2A, 2B, and 3, flowchart 360 begins with generating waveform 118/418 for driving input interface(s) 130/230/230a/230b of acoustic object 120/220 of sound system 100 (action 361). In some implementations, waveform 118/418 may be a waveform selected from one or more predetermined or default waveforms programmed into sound modulation software code 116/416. However, in other implementations, waveform 118/418 for driving input interface(s) 130/230/230a/230b may be generated based on capacitance 144 of acoustic object 120/220, as detected by capacitance sensing unit 140. Waveform 118/418 may be generated by computing platform 110/410 using sound modulation software code 116/416, executed by hardware processor 112/412.

Figure 4B:
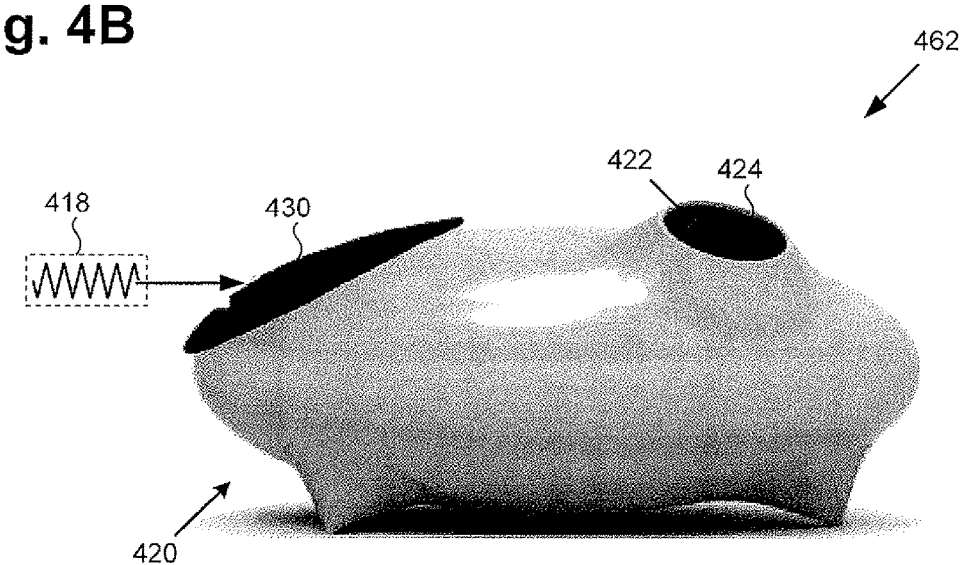
FIG. 4B shows an exemplary diagram corresponding to a subsequent action of the method outlined by the flowchart of FIG. 3.

Referring to FIG. 4B, FIG. 4B shows diagram 462 depicting acoustic object 410 and waveform 418 received at input interface 430 of acoustic object 420. As further shown by FIG. 4B, in addition to input interface 430, acoustic object 420 includes resonant cavity 422 having outlet 424.

Acoustic object 420 including input interface 430 and resonant cavity 422 having outlet 424 corresponds in general to acoustic objects 120 and 220 in respective FIGS. 1 and 2A, and those corresponding features may share the characteristics attributed to any corresponding feature by the present disclosure. In addition, input interface 430 corresponds in general to input interface 230, in FIG. 2B, and those corresponding features may share any of the characteristics attributed to either corresponding feature by the present disclosure.

Flowchart 360 continues with receiving waveform 118/418 as a first input (action 362). Waveform 118/418 is received by conductive plate 234 of input interface 130/230/230a/230b/430 of acoustic object 120/2201420. As a result of receiving waveform 118/418, a varying electrostatic field corresponding to waveform 118/418 is produced above conductive plate 234.

Figure 4C:
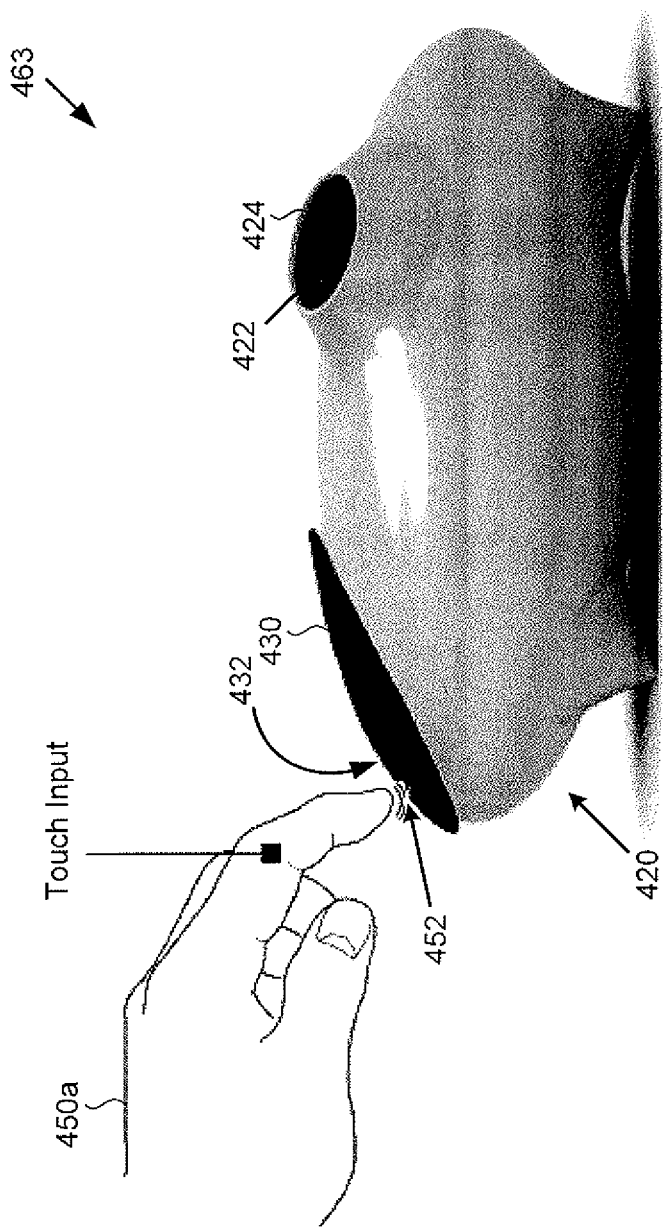
FIG. 4C shows an exemplary diagram corresponding to a subsequent action of the method outlined by the flowchart of FIG. 3.

Moving to FIG. 4C with continued reference to FIGS. 1, 2A, 2B, and 3, flowchart 360 continues with receiving a second input as touch input 452 from hand 450a of a user of acoustic object 120/220/420 (action 363). As shown by diagram 463, touch input 452 is received at surface film 232/432 of input interface 130/230/230a/230b/430 of acoustic object 120/220/420. Upon receiving touch input 452, electroadhesion couples touch input 452 to the varying electrostatic field corresponding to waveform 118/418 that has been produced above conductive plate 234. As a result, an acoustic effect is generated that may not be audible at input interface 130/230/230a/230b/430.

Figure 4D:
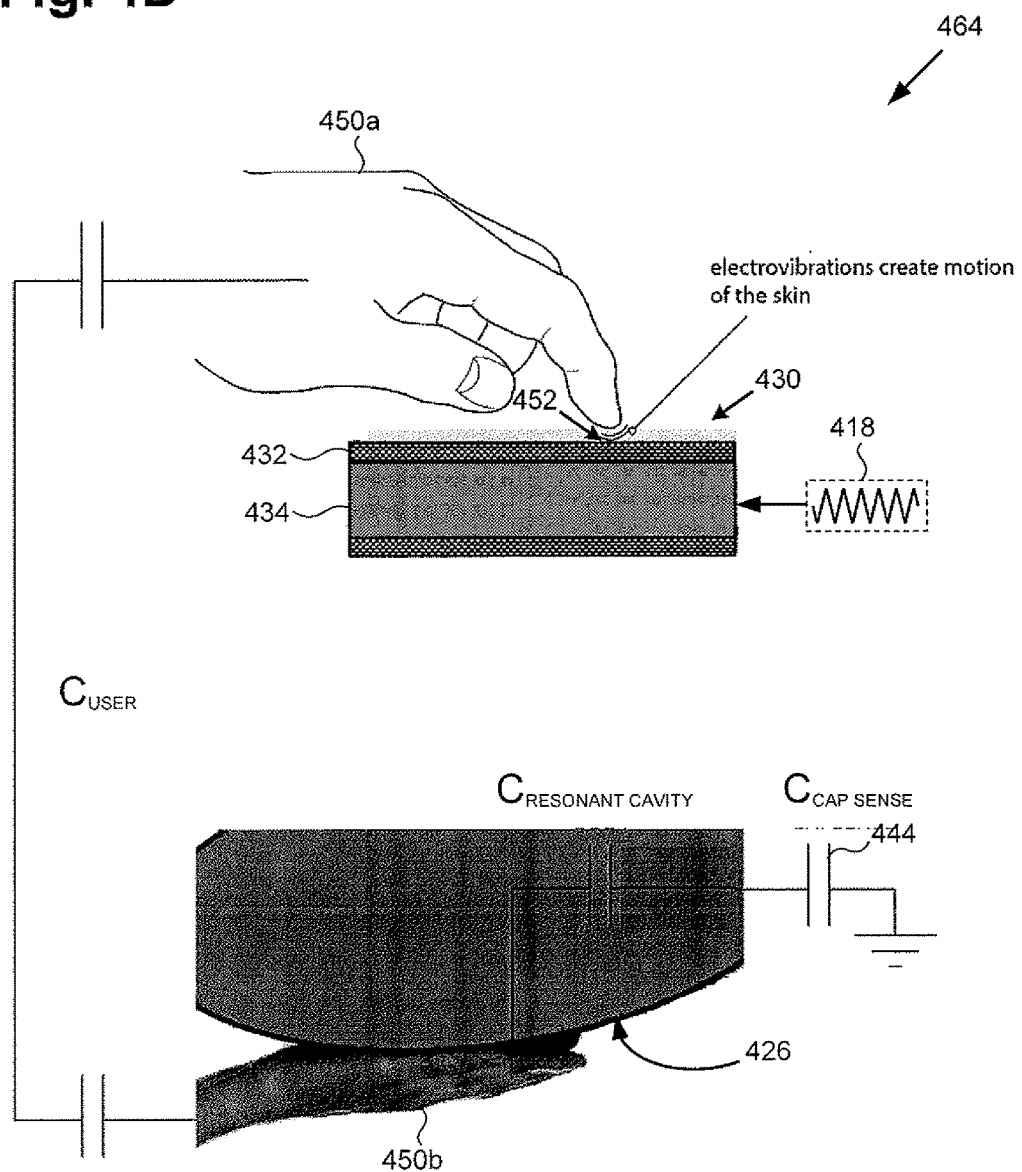
FIG. 4D shows an exemplary diagram corresponding to a subsequent action of the method outlined by the flowchart of FIG. 3.
Figure 4E:
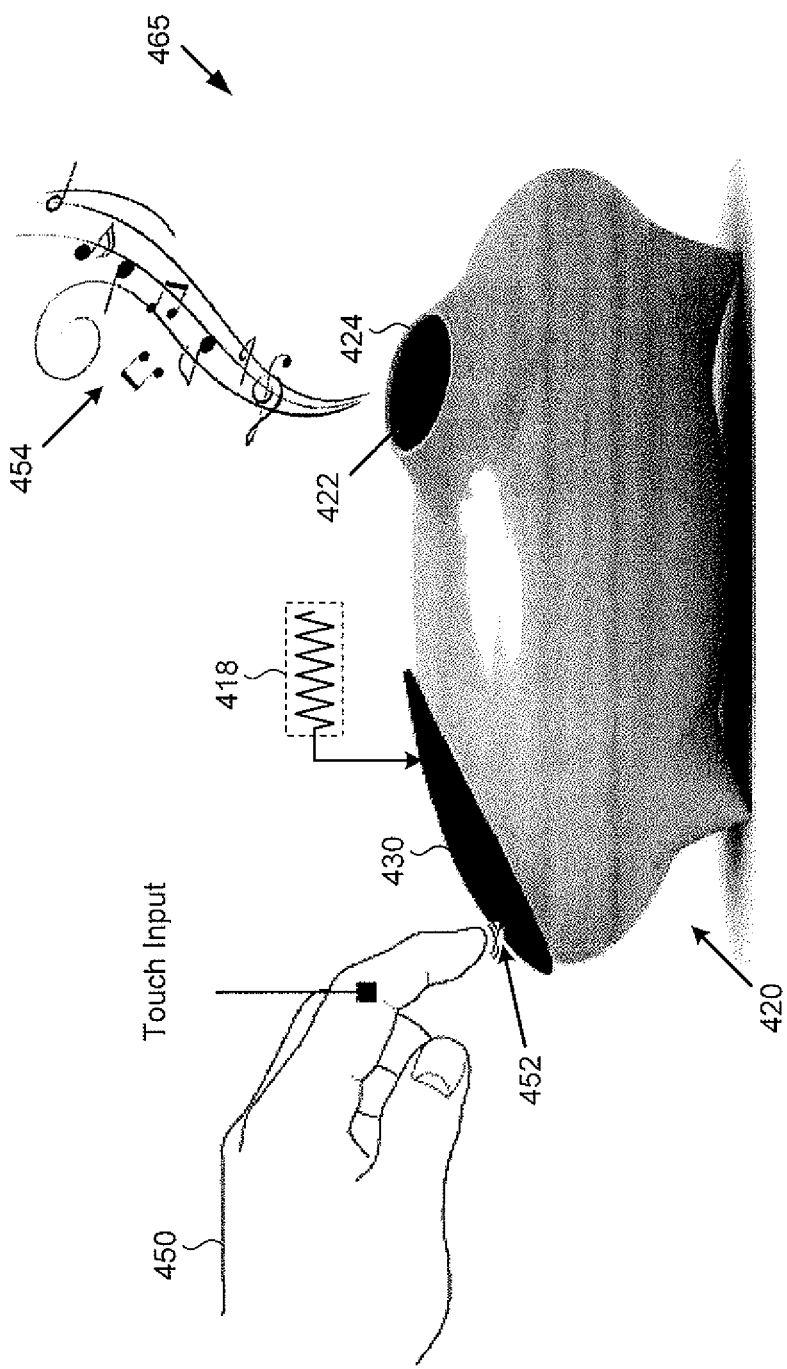
FIG. 4E shows an exemplary diagram corresponding to a final action of the method outlined by the flowchart of FIG. 3.

Referring to FIG. 4D, FIG. 4D shows diagram 464 depicting the affect of a user interaction with capacitance 144/444 of acoustic object 120/220/420. As shown in FIG. 4D, touch input 452 is received at surface film 232/432 of input interface 130/230/230a/230b/430 from hand 450a of a user of acoustic object 120/220/420. In addition, conductive plate 234/434 of input interface 130/230/230a/230b/430 concurrently receives waveform 118/418.

As further shown by FIG. 4D, the user of acoustic object 120/220/420 can change capacitance 144/444 of acoustic object 120/220/420 by placing their other hand 450b on surface 126/226/426 of acoustic object 120/220/420. Moreover, the user of acoustic object 120/220/420 can continue to vary, i.e., modulate capacitance 144/444 of acoustic object 120/220/420 by touching different portions of surface 126/226/426.

Flowchart 360 continues with sensing a change to capacitance 144/444 of acoustic object 120/220/420 (action 364). The change in capacitance 144/444 of acoustic object 120/220/420 may be sensed by capacitance sensing unit 140 of sound system 100, using capacitance sensors 142.

Moving to FIG. 4E, FIG. 4E shows diagram 465 depicting acoustic object 120/220/420 producing audible sound 454, which may be emitted from outlet(s) 124/224a/224b/424 of resonant cavity 122/222/422. It is noted that resonant cavity 122/222/422 is designed to amplify the acoustic effect generated by action 363. As a result, the acoustic effect, which may not be audible at input interface 130/230/230a/230b/430 when it is generated, is amplified and emitted from outlet(s) 124/224a/224b/424 as audible sound 454.

Flowchart 360 can conclude with modulating waveform 118/418 for driving input interface 130/230/230a/230b/430 based on the change to capacitance 144/444 of acoustic object 120/220/420 (action 365). Modulation of waveform 118/418 based on a change or changes to capacitance 144/444 sensed using capacitance sensing unit 140 may be performed by sound modulation software code 116/416, executed by hardware processor 112/412.

Thus, the combination of inputs provided as touch input 452, and waveform 118/418, which may be generated based on capacitance 144/444 prior to any change to capacitance 144/244 due to a user interaction, generate an acoustic effect that is amplified by resonant cavity 122/222/422 to produce audible sound 454. Moreover, audible sound 454 can be modulated based on subsequent changes to capacitance 144/444 of acoustic object 120/220/420 resulting from contact by the user with surface 126/226/426 of acoustic object 120/220/420. The result of those inputs and interactions can advantageously result in the production of pleasingly modulated audible sounds, such as music.

As described above, the present application discloses sonic field sound systems and methods for their use. By applying an electrical waveform to an input interface of an acoustic object, which may be an everyday object, a varying electrostatic field is generated at a surface of the input interface. When the input interface receives a second input in the form of a touch input from a user, the user's finger and the surface form a transducer that renders a sound that may initially be inaudible. By using a resonance cavity provided by the shape of the acoustic object to amplify the sound, and by modulating the electrical waveform applied to the input interface based on changes in the capacitance of the acoustic object, audible sound can be produced.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

What is claimed is:

1. A sound system comprising:
a computing platform including a hardware processor and a memory having a sound modulation software code stored therein;
an acoustic object coupled to an input of the computing platform via a capacitance sensing unit;
the acoustic object having at least one input interface coupled to an output of the computing platform, the acoustic object further including a resonant cavity having at least one outlet;
wherein the hardware processor is configured to execute the sound modulation software code to generate a waveform for driving the at least one input interface of the acoustic object via the output of the computing platform for producing a sound.

2. The sound system of claim 1, wherein the waveform for driving the at least one input interface is generated based on a capacitance of the acoustic object.

3. The sound system of claim 1, wherein the capacitance sensing unit comprises a plurality of capacitive sensors distributed at a surface of the acoustic object.

4. The sound system of claim 1, wherein the at least one input interface of the acoustic object comprises a conductive plate covered by a dielectric film.

5. The sound system of claim 1, wherein the acoustic device is configured to receive a touch input at the at least one input interface of the acoustic object, and to emit audible sound from the at least one outlet of the resonant cavity, the audible sound generated in the resonant cavity based on the touch input and the waveform for driving the at least one input interface.

6. The sound system of claim 1, wherein the hardware processor is further configured to execute the sound modulation software code to modulate the waveform for driving the at least one input interface of the acoustic object based on a change to a capacitance of the acoustic object.

7. The sound system of claim 1, wherein the at least one input interface of the acoustic object includes a plurality of input interfaces.

8. The sound system of claim 1, wherein the at least one outlet of the resonant cavity includes a plurality of outlets.

9. The sound system of claim 1, wherein the acoustic object is a free standing object.

10. The sound system of claim 1, wherein the acoustic object is a handheld object.

11. A method for use by a sound system including a computing platform having a hardware processor and a memory storing a sound modulation software code, and an acoustic object coupled to an input of the computing platform via a capacitance sensing unit, the acoustic object having at least one input interface coupled to an output of the computing platform, and a resonant cavity having at least one outlet, the method comprising:
   generating, by the sound modulation software code executed by the hardware processor, a waveform for driving the at least one input interface;
   receiving, by the at least one input interface, the waveform as a first input;
   receiving, by the at least one input interface, a second input as a touch input from a user of the acoustic object;
   sensing, by the capacitance sensing unit, a change to a capacitance of the acoustic object; and
   modulating, by the sound modulation software code executed by the hardware processor, the waveform for driving the at least one input interface based on the change to the capacitance of the acoustic object.

12. The method of claim 11, further comprising emitting, by the acoustic object, audible sound from the at least one outlet of the resonant cavity.

13. The method of claim 12, wherein the audible sound is generated in the resonant cavity by the first input and the touch input to the at least one input interface.

14. The method of claim 11, wherein the waveform for driving the at least one input interface is generated based on the capacitance of the acoustic object prior to the change to the capacitance.

15. The method of claim 11, wherein the capacitance sensing unit comprises a plurality of capacitive sensors distributed at a surface of the acoustic object.

16. The method of claim 11, wherein the at least one input interface of the acoustic object comprises a conductive plate covered by a dielectric film.

17. The method of claim 11, wherein the at least one input interface of the acoustic object includes a plurality of input interfaces.

18. The method of claim 11, wherein the at least one outlet of the resonant cavity includes a plurality of outlets.

19. The method of claim 11, wherein the acoustic object is a free standing object.

20. The method of claim 11, wherein the acoustic object is a handheld object.

* * * * *